United States Patent
Frank et al.

(10) Patent No.: US 8,948,828 B2
(45) Date of Patent: Feb. 3, 2015

(54) APPARATUS AND METHOD FOR COOLING A SUPER CONDUCTING MACHINE

(75) Inventors: Michael Frank, Uttenreuth (DE); Peter Van Hasselt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 127 days.

(21) Appl. No.: 13/822,128

(22) PCT Filed: Sep. 19, 2011

(86) PCT No.: PCT/EP2011/066167
§ 371 (c)(1),
(2), (4) Date: Mar. 11, 2013

(87) PCT Pub. No.: WO2012/038357
PCT Pub. Date: Mar. 29, 2012

(65) Prior Publication Data
US 2013/0165325 A1   Jun. 27, 2013

(30) Foreign Application Priority Data

Sep. 22, 2010   (DE) .......................... 10 2010 041 194

(51) Int. Cl.
*G01R 33/035* (2006.01)
*H01L 39/02* (2006.01)
*F25B 39/00* (2006.01)
(Continued)

(52) U.S. Cl.
CPC ................ *H01L 39/02* (2013.01); *F25B 39/00* (2013.01); *B63H 21/383* (2013.01); *F28D 15/0266* (2013.01); *F28D 15/06* (2013.01); *H02K 55/04* (2013.01); *F28D 2015/0216* (2013.01); *Y02E 40/625* (2013.01); *F25D 19/00* (2013.01); *F25B 2400/06* (2013.01); *F25B 2400/17* (2013.01)

USPC .......................................................... 505/163

(58) Field of Classification Search
CPC ........... G01R 33/0358; G01R 33/0352; H01L 39/225; H01L 39/2496
See application file for complete search history.

(56) References Cited

U.S. PATENT DOCUMENTS 4,961,463 A   10/1990  DenHartog
5,587,880 A   12/1996  Larson
(Continued)

FOREIGN PATENT DOCUMENTS

DE   10158758 A1   7/2003
DE   10158758 A1   7/2003
(Continued)

OTHER PUBLICATIONS

Australian Office Action mailed Mar. 25, 2014.
"Proc. 16th Int. Cryog. Engng. Conf. (ICEC 16)"; "Proc. 16th Int. Cryog. Engng. Conf. (ICEC 16)"; Seiten 33 bis 44, 1109-1129, 199, 20.-24.05.96; Kitakyushu, JP; Elsevier Science; 1996; JP.
(Continued)

*Primary Examiner* — Colleen Dunn
(74) *Attorney, Agent, or Firm* — Harness, Dickey & Pierce, P.L.C.

(57) ABSTRACT

An apparatus and a method for cooling a super conducting machine are disclosed, in which at least two condenser areas each make thermal contact with a cold head, and in which the at least two condenser areas each have a connecting line, via which the at least two condenser areas are connected fluidically to an evaporator area. A liquid cooling fluid can be moved or pumped from at least one condenser area into the evaporator area by way of a temperature difference, and a pressure difference associated therewith, in the at least two condenser areas.

36 Claims, 2 Drawing Sheets

(51) Int. Cl.
    *B63H 21/38*     (2006.01)
    *F28D 15/02*     (2006.01)
    *F28D 15/06*     (2006.01)
    *H02K 55/04*     (2006.01)
    *F25D 19/00*     (2006.01)

(56) References Cited

U.S. PATENT DOCUMENTS

| | | |
|---|---|---|
| 5,848,532 A | 12/1998 | Gamble |
| 6,477,847 B1 | 11/2002 | Arman |
| 7,272,938 B2 | 9/2007 | Frank et al. |
| 2005/0009418 A1 | 1/2005 | Ries et al. |
| 2005/0160744 A1 | 7/2005 | Frank et al. |
| 2006/0105642 A1 | 5/2006 | Ries et al. |
| 2007/0095075 A1 | 5/2007 | Frank |
| 2007/0180846 A1 | 8/2007 | Kummeth et al. |

FOREIGN PATENT DOCUMENTS

| | | |
|---|---|---|
| DE | 10321463 A1 | 12/2004 |
| DE | 10321463 A1 | 12/2004 |
| DE | 102004001805 B3 | 6/2005 |
| DE | 102004001805 B3 | 6/2005 |
| DE | 102005002361 B3 | 6/2006 |
| DE | 102005002361 B3 | 6/2006 |
| DE | 102006035094 B3 | 4/2008 |
| DE | 102006035094 B3 | 4/2008 |
| JP | 05036526 A | 2/1993 |
| JP | 2001004236 A | 1/2001 |
| JP | 2005528867 A | 9/2005 |
| WO | WO 00/13296 | 3/2000 |

OTHER PUBLICATIONS

International Search Report PCT/ISA/210 for International Application No. PCT/EP2011/066167 dated Dec. 22, 2011.
Japanese Notice of Allowance and English translation thereof dated Jul. 29, 2014.

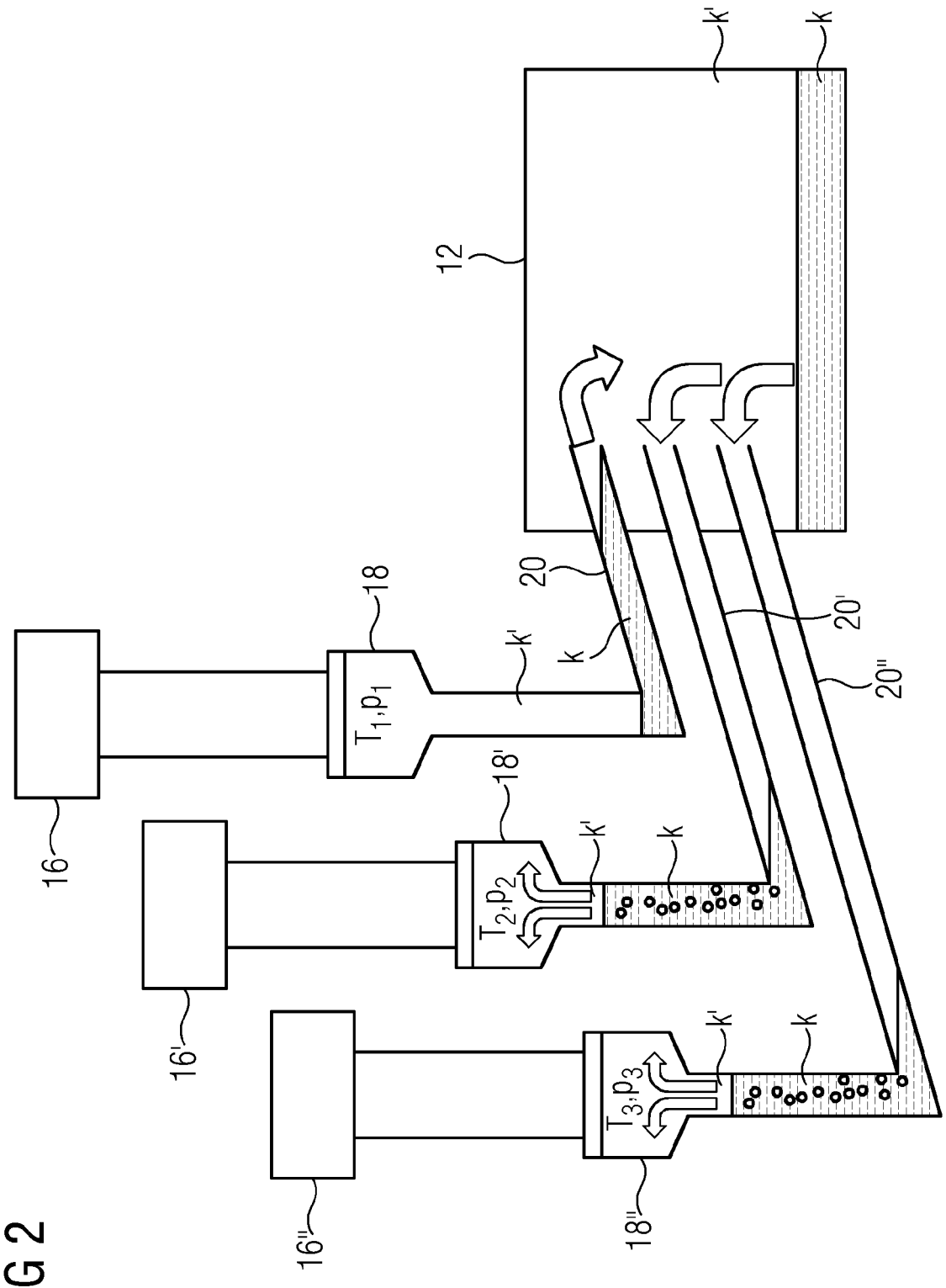

APPARATUS AND METHOD FOR COOLING A SUPER CONDUCTING MACHINE

PRIORITY STATEMENT

This application is the national phase under 35 U.S.C. §371 of PCT International Application No. PCT/EP2011/066167 which has an International filing date of Sep. 19, 2011, which designated the United States of America and which claims priority to German patent application number DE 10 2010 041 194.9 filed Sep. 22, 2010, the entire contents of each of which are hereby incorporated herein by reference.

FIELD

At least one embodiment of the present invention generally relates to an apparatus and a method for cooling a superconducting machine, in which at least two condenser chambers each make thermal contact with a cold head and in which the at least two condenser chambers each have a connecting line, via which the at least two condenser chambers are connected fluidically to an evaporator chamber.

BACKGROUND

Superconducting machines usually comprise superconducting coils which must be reliably cooled, at least during the operation of the machine. Metal oxide superconductive materials with critical temperatures Tc of over 77 K have been known since 1987. These materials are also known as High Tc Superconductive (or HTS) materials and, in principle, facilitate a cooling technique using liquid nitrogen ($LN_2$). Machines which include coils with HTS may thus be cooled and/or operated, for example, with liquid nitrogen ($LN_2$) or with liquid neon (LNe).

Refrigeration units in the form of so-called cryocoolers with closed compressed helium gas circuits are preferred for the cooling of windings with HTS material. Such cryocoolers are in particular of the Gifford-McMahon or Stirling type, or are designed as so-called pulse tube refrigerators. They have the advantage that their refrigerating capacity is available almost at the touch of a button and the use of cryogenic fluids is avoided. When such refrigeration devices are used, the superconducting winding is indirectly cooled e.g. by heat conduction to a cold head of a refrigerator (cf. e.g. "Proc. 16th Int. Cryog. Engng. Conf. (ICEC 16)", Kitakyushu, J P, 20.-24 May 1996, Verlag Elsevier Science, 1997, pages 1109 to 1129).

A refrigeration technique, such as the one described e.g. in DE 103 21 463 A1, can be used for cooling the rotors of electrical machines. The rotor contains a rotating winding comprising HTS conductors, which are located in a thermally conductive winding mount. This winding mount is equipped with a central, axially extending cylindrical cavity, to which are connected pipe sections that lead laterally out of the winding mount. These pipe sections lead to a condenser chamber of a refrigeration unit, which condenser chamber is located in a geodetically higher position, and, together with this condenser chamber and the central rotor cavity, form a closed one-pipe system. This pipe system contains a refrigerant or cooling fluid, which circulates using a so-called thermosiphon effect. Cooling fluid condensate in the condenser chamber is thus transported via the pipe sections into the central cavity, where it absorbs heat and evaporates due to the thermal coupling to the winding mount and thus to the HTS winding. The evaporated cooling fluid then flows, via the same pipes, back into the condenser chamber, where it is re-condensed. The refrigerating capacity required for this purpose is provided by a refrigerating machine, the cold head of which is thermally coupled to the condenser chamber.

This return flow of the refrigerant is driven by a slight overpressure into the central cavity, which acts as an evaporator part, to the parts of the refrigerating machine which act as a condenser unit. This differential pressure, which is produced by the creation of gas in the evaporator and by the liquefaction in the condenser chamber, therefore leads to the desired refrigerant return flow. Corresponding refrigerant flows are known in principle from so-called heat pipes.

Therefore, among the known machines with thermosiphon cooling by means of a suitable refrigeration unit, the liquid refrigerant is transported using only the force of gravity, so that no further pumping systems are required. This requires a refrigeration unit or a condenser chamber, which must essentially be located in a geodetically higher position than the machine and/or the winding mount. The disadvantages associated with this are particularly prevalent where there are spatial limitations around the machine and the refrigeration unit structure. Thus, e.g. in a machine with vertically arranged machine axis, an object driven by the machine, e.g. a motor, may be disposed above the machine. The machine is installed in its surrounding area such that there is no free space available in the plane of the machine. The geodetically higher position is occupied by the object being driven, and a arrangement of the refrigeration unit geodetically higher is not possible in this situation. Even in complex applications, such as e.g. for railcars on railroads, the construction height of the railcar may be restricted e.g. due to regulations relating to the height of overhead lines and/or tunnels. If the machine dimensions are within the range allowed by the height regulations, it may still not be possible for the refrigeration unit to be arranged in a geodetically higher position than the machine, even if the machine axle is positioned horizontally.

A further case in which problems may occur with a purely gravity-driven refrigerant flow is on ships or offshore installations. If a machine installation as described above is used on ships or offshore installations, then static imbalances, known as "trim", of e.g. up to ±5° and/or dynamic imbalances of e.g. up to ±7.5° longitudinally, are frequently to be expected. In order to obtain approval for use on vessels from a classification body, the cooling system of such a machine installation must consequently guarantee reliable refrigeration on board a seagoing vessel even under these conditions. If the said imbalances of the machine are to be tolerated, then there is a risk that an area of the pipe sections between the central rotor cavity and the refrigeration unit will come to be geodetically lower than the central rotor cavity. As a result, the refrigerant will not be able to reach the rotor cavity to be cooled using the force of gravity. The cooling of the machine and therefore its operation would therefore no longer be guaranteed.

In order to guarantee reliable cooling even in the event of machinery imbalances, it is possible for the machine to be arranged at an angle to the horizontal, so that, even assuming maximum trim positions or oscillation amplitudes in the thermosiphon pipe system, an inclination toward the rotor cavity is always present. However, it is precisely in shipbuilding that such an inclined arrangement is undesirable, especially with greater machine lengths, because of the large space requirement that would be necessitated. Alternately, instead of a one-pipe system for circulating refrigerant between a condenser chamber and the evaporator chamber, in which the liquid and the gaseous refrigerant flow to and from the condenser chamber through the same pipe sections, a two-pipe system may be used. This system uses the thermosiphon effect as described e.g. in WO 00/13296 A. However, an additional pipe for the gaseous refrigerant must be provided in the area of the hollow rotor shaft. The condenser chamber must be geodetically positioned in relation to the evaporator chamber at a height that is sufficient to guarantee a reliable flow of cooling fluid by force of gravity from the condenser chamber into the evaporator chamber. This requires installation space, the availability of which may be limited, e.g. on ships.

A further alternative is offered by the use of a mechanical pump and/or mechanical valves. The refrigerant may be forced through by a pumping system. However, this would necessitate a considerable amount of equipment, particularly if the refrigerant has a temperature of 25 to 30 K, for example. Circulating pumps of this kind cause considerable losses and are scarcely able to fulfill the service life requirements of shipbuilding, which involve long maintenance intervals.

SUMMARY

At least one embodiment of the present invention provides an apparatus and a method for cooling a superconducting machine, which facilitates reliable cooling even when the machine is affected by imbalances. It is therefore necessary to dispense with mechanically moving parts, such as e.g. mechanical pumps and valves, since at cryogenic temperatures these are complex, costly and prone to problems. A further object of the invention is to provide an apparatus and a method in which a cooling fluid can also be moved against the direction or effect of the force of gravity without mechanically moving parts, such as e.g. mechanical pumps and valves.

An apparatus for cooling a superconducting machine is disclosed, as is a method for cooling a superconducting machine.

Advantageous embodiments of the inventive apparatus and of the method for cooling a superconducting machine will emerge from the respective dependent subclaims. The features of these subordinate claims may be combined with one another and with features of the subclaims, and features of the subclaims may be combined with one another.

The apparatus of at least one embodiment for cooling a superconducting machine has at least two condenser chambers, which each make thermal contact with a cold head, the at least two condenser chambers each having a connecting line via which the at least two condenser chambers are connected fluidically to an evaporator chamber. The at least two condenser chambers are designed in such a way that a liquid cooling fluid can move even against the force of gravity, from at least one condenser chamber into the evaporator chamber as a result of a pressure difference between a first pressure in the first condenser chamber and a second pressure in the second condenser chamber. The pressures are determined in each case by the temperature in the condenser chambers (boiling point curve of the coolant).

By using two condenser chambers, each with a connecting line to the evaporator chamber, the temperatures in the condenser chambers can be differently set via the cold heads that are in each case thermally coupled to the condenser chambers. This enables a pressure difference to be created between the condenser chambers or their interior areas, which are filled with liquid and/or gaseous cooling fluid. In a condenser chamber in which the temperature is increased, fluid evaporates and/or the gaseous cooling fluid expands and the pressure increases. In a condenser chamber in which the temperature is lowered or reduced, the pressure is reduced since gaseous coolant is condensed. By different variation of the temperature in the condenser chambers or via the cold heads, a pressure difference is formed between the condenser chambers.

The pressure difference causes a movement of liquid cooling fluid out of at least one connecting line into the evaporator chamber. Thus, as a result of greater pressure in a condenser chamber compared to the evaporator chamber, which may result from greater pressure in one condenser chamber compared to another condenser chamber, cooling fluid in the connecting pipe of the one condenser chamber is also moved into the evaporator chamber against the force of gravity, if the pressure difference is sufficiently large. No moving parts whatsoever, such as valves or mechanical pumps, are necessary for this purpose.

At least three condenser chambers, each with a cold head, may also be used, wherein, particularly in the at least three condenser chambers, temperature can be set in a regulated or controlled way via the respectively assigned cold heads independently of one another. The temperature is then advantageously lowered in two condenser chambers and increased in one condenser chamber simultaneously. It is possible in this case for the condenser chambers in which the temperature is increased and lowered to be switched in succession, yet with the temperature always being raised in one and lowered in the others. As a result of this, liquid cooling fluid always flows out of one connecting pipe and reliable cooling is guaranteed. In the two condenser chambers in which the temperature is lowered, while liquid cooling fluid flows out of the connecting line of the third condenser chamber into the evaporator chamber, gaseous cooling fluid can be liquefied, which fluid can flow from the evaporator chamber into the two previous condenser chambers.

A closed, in particular a sealed, cooling circuit can be formed via the condenser chambers, the connecting pipes and the evaporator chamber. No cooling fluid is lost and the cooling circuit does not require any maintenance and does not need to be refilled with cooling fluid, particularly if a suitably dimensioned compensating reservoir is provided.

The apparatus can be filled with a cooling fluid, which comprises or consists of a homogeneous fluid, in particular liquid nitrogen or liquid neon, or which comprises a mixture of liquid coolants with different condensation temperatures. The evaporation temperature of the cooling fluid determines the temperature to which the superconducting winding or machine can be cooled, i.e. which superconducting materials can be used. The condensation temperature of the cooling fluid determines the temperature to which the cold heads must cool the condenser chamber, in order to reliquefy the evaporated gaseous cooling fluid. By means of mixtures or additions to the cooling fluids, temperatures at which the cooling fluid evaporates or is liquefied, which are between temperatures at which pure substances, e.g. pure nitrogen or pure helium, evaporate or are liquefied, can also be set.

The superconducting machine may be a motor or a generator, particularly with a rotor having at least one superconducting winding, wherein the rotor is rotatably arranged around an axis. The superconducting winding may consist of or comprise HTS material. This enables nitrogen to be used as the cooling fluid. The machine may be used e.g. in ships.

The condenser chambers and the cold heads respectively assigned to them may be arranged in a stationary position outside the rotor and the evaporator chamber may be rotatably arranged inside the rotor, in particular as a cylindrical cavity along the rotation axis of the rotor. The connecting pipes can extend into the evaporator chamber according to the thermosiphon principle and can also be stationary. Favorable features of the machine are thereby achieved.

An inventive method of at least one embodiment for cooling a superconducting machine, in particular using the thermosiphon effect, comprises the steps:

A) that a temperature is increased in a first condenser chamber which is thermally connected to a first cold head, wherein the pressure in the condenser chamber is increased, and liquid cooling fluid is moved in a first connecting pipe between the first condenser chamber and an evaporator chamber by the temperature increase and/or gas expansion in the evaporator chamber, and B) that a temperature is constantly maintained or lowered simultaneously in at least one second condenser chamber, which is thermally connected to a second cold head, the temperature in particular being lower than in the first condenser chamber, as a result of which gaseous cooling fluid is moved from the evaporator chamber into the second condenser chamber, in particular via a second connecting pipe between the evaporator chamber and the second condenser chamber, as a result of the temperature increase in the first condenser chamber and/or the lowering of the temperature in the second condenser chamber.

This pressure difference is created or increased by the temperature increase in the first condenser chamber, as a result of which the resulting overpressure in the first condenser chamber, even compared to the pressure in the evaporator chamber, causes the liquid cooling fluid to be forced into the evaporator chamber. A temperature increase can be implemented quickly and easily, as a result of which large pressure differences can be generated and the liquid cooling fluid can be moved in the connecting pipe against the force of gravity through large differences in height ranging from centimeters to meters.

An alternate method of at least one embodiment for cooling a superconducting machine, in particular using the thermosiphon effect, comprises the steps:

C) that a constant temperature is maintained in a first condenser chamber, which is thermally connected to a cold head and which is fluidically connected to an evaporator chamber via a first connecting pipe, and D) that a temperature is lowered simultaneously in at least one second condenser chamber which is thermally connected to a second cold head, as a result of which gaseous cooling fluid is moved from the evaporator chamber into the second condenser chamber, via a second connecting pipe between the evaporator chamber and the second condenser chamber, as a result of the temperature reduction in the second condenser chamber, and E) as a result of which liquid cooling fluid is moved into the evaporator chamber in the first connecting pipe between the first condenser chamber and the evaporator chamber as a result of the temperature reduction in the at least second condenser chamber.

The pressure difference in this case is created or increased as a result of the temperature reduction in the at least second condenser chamber, as a result of which the resulting overpressure in the first condenser chamber, even compared to the pressure in the evaporator chamber, causes the liquid cooling fluid to be forced into the evaporator chamber. If the temperature is lowered, gaseous cooling fluid in the at least second condenser chamber can be liquefied simultaneously, which liquid may be moved into the evaporator chamber at a later time.

A temperature can be constantly maintained or lowered simultaneously at least in one third condenser chamber, which is thermally connected to a third cold head. Thus e.g. in steps C) to E) a greater negative pressure can be generated in the first condenser chamber and, in a short time, more liquid cooling fluid can be moved into the evaporator chamber. In steps A) and B) the effect of a pressure difference being created between first and second condenser chamber may be supported by a third condenser chamber and, likewise in a short time, more liquid cooling fluid can be moved into the evaporator chamber.

Directly or indirectly subsequent to steps A) and B) or C) to E), in the at least one condenser chamber, in which the temperature at the time of steps A) and B) or C) to E) was increased or maintained at a constant level, the temperature can be lowered or maintained at a constant level. In the at least one second, in particular the second and third, condenser chamber, in which the temperature at the time of steps A) and B) or C) to E) was maintained at a constant level or lowered, the temperature can be increased or maintained at a constant level.

A further alternate method of at least one embodiment for cooling a superconducting machine, in particular using the thermosiphon effect, comprises the steps that, in a first condenser chamber, which is thermally connected to a first cold head, and that, in at least one second condenser chamber which is thermally connected to a second cold head, a temperature is simultaneously increased, wherein the temperature and/or temperature increase in the first condenser chamber is greater than in the second condenser chamber, as a result of which in the first condenser chamber more cooling fluid is evaporated than in the second condenser chamber and/or gas is more expanded and/or a pressure difference is created or increased between the pressure in the first and second condenser chamber, as a result of which liquid cooling fluid k is moved in a first connecting pipe between the first condenser chamber and an evaporator chamber, and gaseous cooling fluid k' is moved from the evaporator chamber into the second condenser chamber, in particular via a second connecting pipe.

Alternately, a method for cooling a superconducting machine of at least one embodiment, in particular using the thermosiphon effect, may comprise the steps that, in a first condenser chamber which is thermally connected to a first cold head, and that, in at least one second condenser chamber which is thermally connected to a second cold head, a temperature is simultaneously reduced, wherein the temperature in the first condenser chamber is lower than in the second condenser chamber, and/or the temperature reduction in the first condenser chamber is greater than in the second condenser chamber, as a result of which more cooling fluid is condensed in the first condenser chamber than in the second condenser chamber and/or gas is more compressed and/or a pressure difference between the pressure in the first and second condenser chamber is created or increased, as a result of which liquid cooling fluid k is moved in a second connecting pipe between the second condenser chamber and an evaporator chamber, and gaseous cooling fluid k' is moved from the evaporator chamber into the first condenser chamber, in particular via a first connecting pipe.

In the two last mentioned methods, a temperature may be increased, maintained or reduced simultaneously, at least in one third condenser chamber which is thermally connected to a third cold head.

Directly or indirectly subsequent thereto, the temperature can be reduced in condenser chambers in which the temperature was increased, and/or directly or indirectly subsequent thereto, the temperature can be increased in condenser chambers in which the temperature was reduced. The advantages described above for methods with at least three condenser chambers, in which their roles are chronologically interchanged, likewise apply in this case.

The method of at least one embodiment can therefore be carried out as a continuous or pulsed process of pumping liquid cooling fluid into the evaporator chamber.

A temperature reduction may be effected by cooling with the help of at least one cold head. A temperature increase may be effected with the help of at least one cold head and/or by heating with the help of a heating device.

A movement of cooling fluid can be regulated or controlled only via differences in pressure and/or temperature in the condenser chambers and the evaporator chamber, particularly in the case of pressure equalization by cooling fluid movement and/or in particular against the force of gravity. Valves or mechanical pumps no longer need to be used in order to move liquid cooling fluid in a connecting line into the evaporator chamber, even against the force of gravity. Problems with mechanical parts at cryotemperatures are thus avoided and maintenance time and costs are reduced.

In the evaporator chamber, the cooling fluid can pass from a liquid into a gaseous state and can cool a rotating superconducting device, in particular a superconducting winding of a rotor of a motor or generator, wherein the superconducting winding comprises in particular HTS material. The evaporator chamber may be rotatably arranged inside the rotor, in particular as a cylindrical cavity along the rotation axis of the rotor.

The at least two cold heads and the at least two condenser chambers and, in particular, the at least two connecting pipes, which—in particular—are contained by an encasing composite pipe, may be arranged in a stationary position. The encasing of the connecting pipes by a composite pipe enables the number of seals and bearings at the transition between fixed and rotating parts to be reduced.

The advantages associated with the apparatus for cooling a superconducting machine, and with the method for cooling a superconducting machine, may be applied to one another by analogy.

Preferred embodiments of the invention with advantageous developments according to the features of the dependent claims are described in greater detail below on the basis of the figures, without being limited thereto.

BRIEF DESCRIPTION OF THE DRAWINGS

In the figures,

FIG. 2 is a simplified schematic illustration of an apparatus for cooling according to an embodiment of the invention.

In the figures, corresponding parts are labeled with the same reference characters.

DETAILED DESCRIPTION OF THE EXAMPLE EMBODIMENTS

Figure 1:
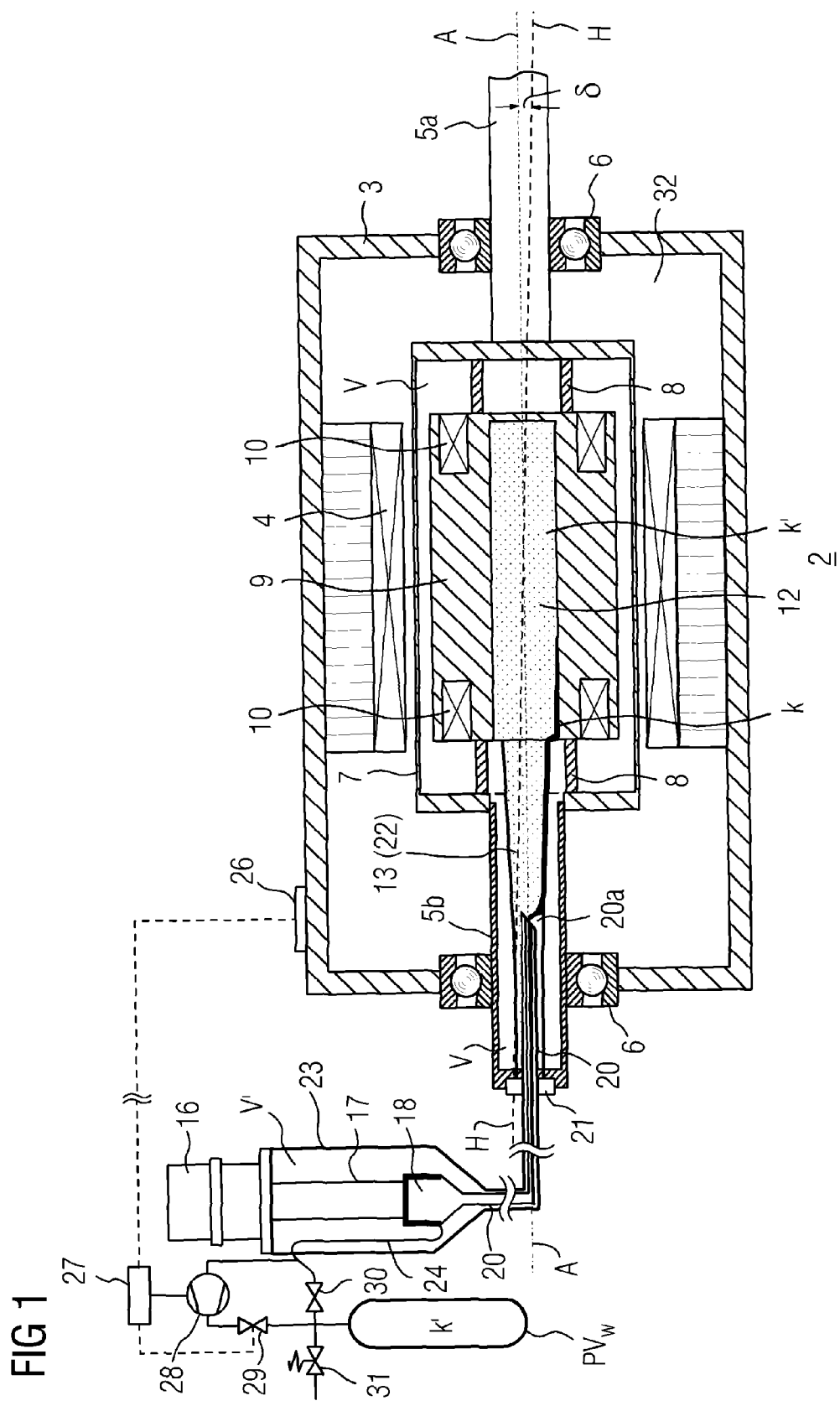
FIG. 1 is a schematic sectional view showing a superconducting machine 2 with an apparatus for cooling according to the prior art.

Machines according to the figures each comprise a stator and rotor and an assigned refrigeration unit. The embodiment of the machine described below may be in particular a synchronous motor or a generator. The machine comprises a rotating, superconducting winding, which principally uses metallic LTS material (low Tc superconductor material) or oxidic HTS material (high Tc superconductor material). It is assumed that the latter material is used for the following exemplary embodiment. The winding may comprise one coil or a system of coils arranged with two poles, four poles, or any other number of poles. The basic structure of a corresponding synchronous machine is shown in FIG. 1, as known from the prior art.

The machine labeled 2 comprises a stationary outer housing 3, which is at room temperature, with a stator winding 4. Within this outer housing and surrounded by the stator winding 4, a rotor 5 is mounted in bearings 6, such that it can rotate around a rotation axis A. These bearings may be conventional mechanical bearings or even magnetic bearings. The rotor further has a vacuum vessel 7, in which a winding mount 9 with an HTS winding 10 is held on e.g. hollow, cylindrical, torque-transmitting suspension elements 8. An axially extending central cavity 12, which may for example be cylindrical in shape, is provided concentrically with respect to the rotation axis A in this winding mount. The winding mount is designed to be vacuum-tight with respect to this cavity. It seals this cavity on one side of the rotor, which is supported on this side by means of a solid axial rotor shaft part 5a. On the opposite side, the central cavity 12 is connected to a lateral cavity 13 with a comparatively smaller diameter. This lateral cavity leads to the exterior out of the area of the outer housing 3 from the area of the winding mount. A tubular rotor shaft part which surrounds this lateral cavity 13 and is mounted in one of the bearings, is labeled 5b.

For indirect cooling of the HTS winding 10 via thermally conductive parts, a refrigeration unit, of which only one cold head 16 is illustrated, is provided. This refrigeration unit may be a cryocooler of the Gifford-McMahon type, or, in particular, a regenerative cryocooler such as e.g. a pulse tube refrigerator or a split Stirling cooler. In this case, the cold head 16 and thus all the main, further parts of the refrigeration unit, are located outside the rotor 5 and/or its outer housing 3.

The cold part of the cold head 16, which is arranged, by way of example, at a distance of several meters from the side of the rotor 5, makes good thermal contact, in a vacuum vessel 23 via a heat-conducting body 17, with a refrigerant condenser unit which has a condenser chamber 18. This condenser chamber is connected to a vacuum-insulated, fixed-position heat pipe 20, which projects into the lateral, rotating cavity 13 or the central cavity 12, laterally in an axial area. A sealing device 21, which is not shown in greater detail in the figure but has at least one sealing element, which may be designed as a ferro fluid seal and/or a labyrinth seal and/or a gap seal, is used to seal the heat pipe 20 from the lateral cavity 13. The central cavity 12 is connected via the heat pipe 20 and the lateral cavity 13 to the heat exchanging area of the condenser chamber 18 such that it is sealed in a gas-tight manner from the exterior. The tubular parts running between the central cavity 12 and the condenser chamber 18, which are used for holding a refrigerant, are generally labeled as pipe sections 22. These pipe sections, together with the condenser chamber 18 and the central cavity 12, are regarded as a pipe system.

These cavities of this pipe system are filled with a refrigerant, which is selected according to the desired operating temperature of the HTS winding 10. Thus, for example, helium (condensation temperature 4.2 K at normal pressure), hydrogen (condensation temperature 20.4 K at normal pressure), neon (condensation temperature 27.1 K at normal pressure), nitrogen (condensation temperature 77.4 K at normal pressure) or argon (condensation temperature 87.3 K at normal pressure) may be considered. Mixtures of these gases may also be used. The refrigerant is circulated using a so-called thermosiphon effect. To achieve this, the refrigerant is condensed on a cold surface of the cold head 16 in the area of the condenser chamber 18. The refrigerant thus liquefied, labeled k, flows through the pipe sections 22 into the central cavity 12. The transport of the condensate takes place in this case under the influence of gravity. For this purpose the heat pipe 20 may advantageously be slightly inclined (by a few degrees) with respect to the rotation axis A toward the earth's center, in order thus to support the flowing of the liquid refrigerant k out of the open end 20a of the pipe 20. The liquid refrigerant is then evaporated in the interior of the rotor. The evaporated refrigerant is labeled k'. This refrigerant evaporated by the absorption of heat then flows through the interior of the pipe sections 22 back into the condenser chamber 18. In this case the return flow is driven by a slight overpressure in the cavity 12, acting as the evaporator, toward the condenser chamber 18, which overpressure is caused by the creation of gas in the evaporator and the liquefaction in the condenser chamber. Since the circulation of the liquefied refrigerant from the condenser chamber 18 into the central cavity 12 and the return flow of the evaporated refrigerant k' from this cavity back to the condenser chamber takes place in the pipe system formed from the condenser chamber 18, the pipe sections 22 and the cavity 12, this can be defined as a one-pipe system with circulation of the refrigerant k, k' using a thermosiphon effect.

As further shown in FIG. 1, an imbalance may occur if the machine 2 is used on ships or offshore installations, wherein the rotation axis A is inclined with respect to the horizontal H by an angle δ of a few degrees. A condensation of the refrigerant still takes place in the condenser chamber 18, but the refrigerant can no longer reach the central cavity 12, so that the pipe sections 20 then gradually fill up with liquid refrigerant k. If the filling quantity of the pipe system with refrigerant is relatively low, the interior rotor space and/or the cavity 12 may run dry and thus are no longer cooled. Even if the pipe system has a greater filling quantity, the flow of liquid refrigerant k in the pipe sections 20 toward the evaporator chamber 12 is blocked after a certain time. A reliable cooling of the rotor or of its superconducting winding is likewise no longer guaranteed in this case.

According to the prior art, provision may therefore be made in this state for the gas pressure to be briefly increased on the condenser side to such an extent that the liquid refrigerant is thereby forced from the pipe sections 20, against the force of gravity (if there is an inclination at the angle δ), into the central cavity 12. Such a pressure increase is effected according to the prior art with the help of a warm buffer volume PVW and a mechanical pump 28. With the help of these resources the gas pressure in the condenser chamber 18 can be temporarily increased, so that liquid refrigerant k located there and in the pipe sections 20 is forced into the central cavity 12. A control valve 29 is therefore disposed in a connecting line 24 between the overpressured buffer volume PVW and the condenser chamber 18, and opens the connection to the pump 28, which then transports the gas k' out of the buffer volume into the condenser chamber. A valve 30 allows surplus gas to flow back out of the condenser chamber 18.

A pressure oscillation to be thus generated may take place continuously, i.e. at short, recurrent intervals (for a short period of time in each case), or may be controlled by a position sensor 26 of known design from a control unit 27. This position sensor detects the imbalance with the angle of inclination δ of the machine 2 and thus triggers the explained initiation of a pressure volume (gas pulse) via the control unit 27.

Further parts for the provision and removal of gas, such as, for example, by a filling valve, from which the system is to be filled with gaseous refrigerant via the connecting line 24, are not shown in FIG. 1, since these parts are generally known.

Only an overpressure valve 31, which responds to unauthorized overpressures in the system, is indicated.

Of course, the parts or receptacles that enclose the refrigerant k or k' must be protected against the introduction of heat. A vacuum surround is therefore expediently provided as thermal insulation, with, if necessary, the possibility of additional insulation such as superinsulation or insulation foam also being provided in the corresponding vacuum areas. The vacuum which is enclosed by the vacuum vessel 7 is labeled V in FIG. 1. This also surrounds the pipe which encloses the lateral cavity 13 and extends as far as the seal 21. The vacuum which surrounds the heat pipe 20 as well as the condenser chamber 18 and the heat-conducting body 17 is labeled V'. If required, a negative pressure may also be generated in the inner cavity 32 which surrounds the rotor and is enclosed by the outer housing 2.

A disadvantage of a system of mechanical pumps 28 and valves 29, 30, 31 is that, in an arrangement of parts in a cryogenic area, which arrangement is not illustrated here for the sake of simplicity, these parts are highly susceptible to problems at cryogenic temperatures and the design of moving parts for use at these temperatures is complex and costly. Particularly with regard to their use on ships, but also in other machine-related uses, maintenance-free operation over long periods is necessary. Mechanically moving parts must therefore be reduced to a minimum, since these are usually liable to break down.

According to the invention, as shown in FIG. 2, a novel cooling principle is used in a machine 2 described above. In this case, parts such as pump 28 and valves 29, 30, 31 can be dispensed with, with all further parts of the machine being analogous to those of the machine described above in FIG. 1, except where otherwise mentioned hereinafter.

In contrast to the apparatus illustrated in FIG. 1, with a cold head 16 and a condenser chamber 18, the example embodiment of the inventive apparatus for cooling a superconducting machine 2, illustrated in FIG. 2, has a first, second and third condenser chamber 18, 18', 18", each with an assigned cold head 16, 16', 16". Alternately, though not shown in the diagram for the sake of simplicity, two or more than three condenser chambers 18 with assigned cold heads 16 may also be present. Each condenser chamber 18, 18', 18" is fluidically connected via a heat pipe 20, 20', 20", which is also referred to hereinafter as a connecting line 20, 20', 20", to the evaporator chamber 12, which is provided in FIG. 1 by the central cavity 12. The connecting lines 20, 20', 20" are designed and arranged with an inclination and a V-shaped or U-shaped bend, i.e. they are angled slightly with reference to the horizontal H as shown in FIG. 1, with a lowermost point at which a fluid can gather under the force of gravity. The connecting lines 20, 20', 20" may however have different forms; what matters is that fluid can collect in their interior similarly to a U-tube manometer.

The condenser chambers 18, 18', 18", with the corresponding connecting lines 20, 20', 20" and the evaporator chamber 12, form a closed system, i.e. an inner cavity that is fluid-tight from the exterior. The inner cavity is filled with a refrigerant k, k', which is hereinafter also called cooling fluid. The cooling fluid may be in a liquid k and/or gaseous k' aggregate state, i.e. may be present as a liquid cooling fluid k and/or as a gaseous cooling fluid k'.

During operation of the machine, in which the superconducting winding 10 of the rotor 5 as already described above in FIG. 1 is cooled to or below a cryogenic temperature Tk, the evaporator chamber 12 is partially filled with liquid cooling fluid k. The cooling fluid k evaporates and thereby conducts heat away from the rotor 5 and/or cools the superconducting winding 10 of the rotor 5. FIG. 2 shows the inventive apparatus for cooling a superconducting machine 2 at a first point in time. At this point in time the gaseous, evaporated cooling fluid k' is transported from the evaporator chamber 12 via the connecting lines 20' and 20" into the condenser chambers 18' and 18". A temperature T2 and T3 in the condenser chambers 18' and 18" is below the condensation temperature of the cooling fluid k, in each case with the help of the assigned cold heads 16' and 16", whereby heat is removed from the gaseous cooling fluid k' and condensed into liquid cooling fluid k. The liquid cooling fluid k gathers in the connecting lines 20' and 20".

In the first condenser chamber 18, starting from a temperature below the condensation temperature of the cooling fluid k, the temperature T1 is increased with the help of the assigned cold head 16 and/or a heating device (not shown for the sake of simplicity), to a temperature T1* above the condensation temperature of the cooling fluid k. Liquid cooling fluid thereby evaporates and/or the gaseous cooling fluid k' expands in the first condenser chamber 18, i.e. the pressure p1 in the first condenser chamber 18 is increased to a level which is higher than the pressures pv in the evaporator chamber 12 and in the two further condenser chambers 18', 18", p2 and p3. Thus liquid cooling fluid k, which is located in the connecting line 20, is forced against the effect of gravity into the evaporator chamber 12, with a compressive force that exceeds the force of gravity of the cooling fluid k. Cooling fluid k is forced from the condenser chamber 18 and the connecting line 20 into the evaporator chamber 12.

This effect is additionally enhanced by a negative pressure p1 and p2 in the condenser chambers 18' and 18", which is produced by the reduction in volume of the gaseous cooling fluid k' during cooling and condensation in the condenser chambers 18' and 18". This negative pressure draws gaseous cooling fluid k' out of the evaporator chamber 12 into the connecting lines 20' and 20" and thus reduces the pressure pv in the evaporator chamber 12. The pressure difference $\Delta p(p1-pv)$ between the first condenser chamber 18 and the evaporator chamber 12 is thereby increased and, in addition to the pressure equalization, moves liquid cooling fluid k from the connecting line 20 into the evaporator chamber 12.

The process described above ends, inter alia, when the liquid cooling fluid k has been completely—or, at least, almost completely—moved from the connecting line 20 into the evaporator chamber 12. In order to guarantee continuous cooling or a continuous, quasicontinuous or pulsed flow of liquid cooling fluid k into the evaporator chamber 12, the temperatures T1, T2, T3 in the condenser chambers 18, 18', 18" may be exchanged in a timely manner via the cold heads 16, 16', 16". In this case the condenser chamber 18 may be cooled to a temperature below the condensation temperature of the cooling fluid via the cold head 16, whereby, for example, the condenser chambers 18 and 18" have the same temperature. The condenser chamber 18' can be heated via the cold head 16' or a heating device (not illustrated for the sake of simplicity) to a temperature which is above the condensation temperature of the cooling fluid. This has the effect that, at a second point in time described in this paragraph, the condenser chamber 18' functions in the same way the condenser chamber 18 at the first point in time, and, at the second point in time, the condenser chambers 18 and 18" function in the same way as the condenser chambers 18' and 18" at the first point in time. In the condenser chamber 18' the increase in temperature creates an overpressure and moves liquid cooling fluid k from the connecting line 20' into the evaporator chamber 12. Since the situation is analogous to the situation illustrated in FIG. 2, only with the roles exchanged (temperatures, pressures and fluid flows) between the condenser chambers 18, 18' and 18", the situation with regard to the process at the second point in time is not illustrated in the figure for the sake of simplicity.

At a third point in time, the action of the condenser chambers 18, 18', 18" can be likewise exchanged, wherein the condenser chamber 18" may be brought to a temperature above the evaporation temperature of the cooling fluid k with the help of the cold head 16". In this case the condenser chambers 18 and 18' may, for example, have the same temperature, a temperature below the condensation temperature of the cooling fluid k'. The condenser chamber 18" may be heated via the cold head 16" or a heating device (not shown for the sake of simplicity) to a temperature, which is above the condensation temperature of the cooling fluid. This has the effect that, at the third point in time, the condenser chamber 18" functions in the same way as the condenser chamber 18 at the first point in time, and, at the third point in time, the condenser chambers 18 and 18' function in the same way as the condenser chambers 18' and 18" at the first point in time. In the condenser chamber 18", the increase in temperature creates an overpressure and moves liquid cooling fluid k from the connecting line 20" into the evaporator chamber 12. Since the situation is analogous to the one illustrated in FIG. 2, only with the roles exchanged (temperatures, pressures and fluid flows) between the condenser chambers 18, 18' and 18", the situation with regard to the process at the third point in time is likewise not shown in the figure for the sake of simplicity.

At a fourth point in time, the status of the first point in time may be reestablished. By regular exchanging of the actions of the condenser chambers 18, 18', 18" after a fixed period of time or after different times, a continuous, quasicontinous or pulsed operation of the apparatus for cooling a superconducting machine 2 can be guaranteed.

Any other sequences for exchanging the action of the condenser chambers 18, 18', 18" are possible, wherein the basic principle remains the same. A reliable cooling operation may thus be guaranteed, even if the machine 2 is tilted e.g. if used in a ship.

The invention claimed is:

1. An apparatus for cooling a superconducting machine comprising:
at least two condenser chambers, each of the at least two condenser chambers making thermal contact with a cold head and each of the at least two condenser chambers including a connecting line, via which the at least two condenser chambers are connected fluidically to an evaporator chamber, the at least two condenser chambers being designed such that a liquid cooling fluid is movable, against the force of gravity, from at least one of the at least two condenser chambers into the evaporator chamber as a result of a pressure difference between a first pressure in a first of the at least two condenser chambers and a second pressure in a second of the at least two condenser chambers, each of the respective first and second pressures being determined by a respective temperature in a respective one of the at least two condenser chambers.

2. The apparatus of claim 1, wherein the at least two condenser chambers include at least three condenser chambers, each of the at least three condenser chambers including a cold head and wherein a temperature is settable in the respective at least three condenser chambers in a regulated or controlled way, via the respectively assigned cold heads, independently of one another.

3. The apparatus of claim 1, wherein a closed cooling circuit is formed via the at least two condenser chambers condenser chambers, the connecting pipes and the evaporator chamber, and/or a cooling circuit, which includes filling devices and at least one storage reservoir.

4. The apparatus of claim 1, wherein the apparatus is filled with a cooling fluid, which comprises a homogeneous fluid or which comprises a mixture of liquid coolants with different condensation temperatures.

5. The apparatus of claim 1 wherein the superconducting machine is a motor or a generator.

6. The apparatus of claim 5, wherein the superconducting machine is a motor or a generator with a rotor including at least one superconducting winding and wherein the condenser chambers and the respective cold heads are arranged in a stationary position outside the rotor and the evaporator chamber is rotatably arranged inside the rotor, as a cavity along the rotation axis of the rotor, the cavity being of cylindrical design.

7. A method for cooling a superconducting machine, comprising:
at least one of
increasing a temperature in a first condenser chamber, thermally connected to a first cold head, wherein cooling fluid is evaporated,
expanding gas in the condenser chamber and
increasing pressure in the condenser chamber, wherein liquid cooling fluid is moved in a first connecting pipe between the first condenser chamber and an evaporator chamber into the evaporator chamber by the at least one of temperature increase, evaporation and gas expansion; and
constantly maintaining or lowering a temperature, simultaneously, in at least one second condenser chamber, thermally connected to a second cold head, as a result of which gaseous cooling fluid is moved from the evaporator chamber into the at least one second condenser chamber as a result of at least one of the temperature increase in the first condenser chamber and the lowering of the temperature in the at least one second condenser chamber.

8. A method for cooling a superconducting machine, comprising:
maintaining a constant temperature in a first condenser chamber, thermally connected to a first cold head and fluidically connected to an evaporator chamber via a first connecting pipe, and
simultaneously lowering a temperature in at least one second condenser chamber, thermally connected to a second cold head, whereby gaseous cooling fluid is moved from the evaporator chamber into the at least one second condenser chamber via a second connecting pipe between the evaporator chamber and the at least one second condenser chamber, as a result of at least one of the temperature reduction, a condensation of cooling fluid and a compression of gas in the second condenser chamber; and
moving, as a result of the maintaining of the constant temperature in the first condenser chamber and the simultaneously lowering of the temperature in the at least one second condenser chamber, liquid cooling fluid into the evaporator chamber in the first connecting pipe between the first condenser chamber and the evaporator chamber as a result of at least one of the temperature reduction, the condensation of cooling fluid and the compression of gas in the at least second condenser chamber.

9. The method of claim 7, wherein a temperature is constantly maintained or lowered simultaneously at least in one third condenser chamber, which is thermally connected to the third cold head.

10. The method of claim 9, wherein, in at least one of the condenser chambers, in which the temperature was increased, the temperature is lowered or kept at a constant level, and wherein, in the at least one second condenser chamber, in which the temperature was maintained at a constant level or was lowered, the temperature is increased or maintained at a constant level.

11. A method for cooling a superconducting machine comprising:
simultaneously increasing a temperature in a first condenser chamber, thermally connected to a first cold head, and in at least one second condenser chamber, thermally connected to a second cold head, wherein at least one of the temperature and temperature increase in the first condenser chamber is relatively greater than in the second condenser chamber, as a result of which, the first condenser chamber, at least one of relatively more cooling fluid is evaporated than in the second condenser chamber, gas is relatively more expanded and a pressure difference is created or relatively increased between a pressure in the first and second condenser chamber; and
moving, as a result of the simultaneously increasing of the temperature in the first condenser chamber and at least one second condenser chamber, liquid cooling fluid in a first connecting pipe between the first condenser chamber and an evaporator chamber, and moving gaseous cooling fluid from the evaporator chamber into the second condenser chamber via a second connecting pipe.

12. A method for cooling a superconducting machine, comprising:
simultaneously lowering a temperature in a first condenser chamber, thermally connected to a first cold head, and in at least one second condenser chamber, thermally connected to a second cold head, wherein the temperature in the first condenser chamber is relatively lower than in the second condenser chamber and/or a temperature reduction in the first condenser chamber is relatively greater than in the second condenser chamber, as a result of which relatively more cooling fluid is condensed in the first condenser chamber than in the second condenser chamber, and/or gas is relatively more compressed and/or a pressure difference is created or relatively increased between the pressure in the first and second condenser chamber; and
moving, as a result of the simultaneously lowering of the temperature in the first condenser chamber and at least one second condenser chamber, liquid cooling fluid in a connecting pipe between the second condenser chamber and an evaporator chamber, and moving gaseous cooling fluid from the evaporator chamber into the first condenser chamber via another connecting pipe.

13. The method of claim 11, wherein a temperature is increased, maintained or lowered simultaneously at least in one third condenser chamber, thermally connected to the third cold head.

14. The method of claim 13, wherein, directly or indirectly subsequent thereto, the temperature is reduced in condenser chambers in which the temperature was increased.

15. The method of claim 7, wherein the method is carried out as a continuous or pulsed process of pumping liquid cooling fluid into the evaporator chamber.

16. The method of claim 7, wherein a temperature reduction is effected by cooling with the help of at least one cold head and/or a temperature increase is effected with the help of at least one cold head by heating with the help of a heating device.

17. The method of claim 7, wherein a movement of cooling fluid is regulated or controlled only via differences in pressure and/or temperature in the condenser chambers and the evaporator chamber.

18. The method of claim 7, wherein, in the evaporator chamber, the cooling fluid can pass from a liquid into a gaseous state, and cools a rotating superconducting device, wherein the superconducting winding comprises HTS material and/or wherein the evaporator chamber is rotatably arranged inside the rotor.

19. The method of claim 7, wherein the at least two cold heads and the at least two condenser chambers and the at least two connecting pipes are arranged in a stationary position.

20. The apparatus of claim 4, wherein the homogeneous fluid is liquid nitrogen, liquid neon or liquid helium.

21. The apparatus of claim 5, wherein the superconducting machine is a motor or a generator with a rotor including at least one superconducting winding, wherein the rotor is rotatably arranged around an axis.

22. The apparatus of claim 21, wherein the at least one superconducting winding comprises HTS material.

23. The method of claim 7, wherein the constantly maintaining or lowering of the temperature in at least one second condenser chamber is done to a relatively lower temperature than in the first condenser chamber, and wherein the gaseous cooling fluid is moved from the evaporator chamber into the second condenser chamber via a second connecting pipe.

24. The method of claim 8, wherein a temperature is constantly maintained or lowered simultaneously at least in one third condenser chamber, which is thermally connected to the third cold head.

25. The method of claim 8, wherein, in at least one of the condenser chambers, in which the temperature was maintained at a constant level, the temperature is lowered or kept at a constant level, and wherein, in the at least one second condenser chamber, in which the temperature was lowered, the temperature is increased or maintained at a constant level.

26. The method of claim 12, wherein a temperature is increased, maintained or lowered simultaneously at least in one third condenser chamber, thermally connected to the third cold head.

27. The method of claim 26, wherein, directly or indirectly subsequent thereto, the temperature is reduced in the condenser chambers in which the temperature was increased.

28. The method of claim 8, wherein the method is carried out as a continuous or pulsed process of pumping liquid cooling fluid into the evaporator chamber.

29. The method of claim 8, wherein a temperature reduction is effected by cooling with the help of at least one cold head and/or a temperature increase is effected with the help of at least one cold head by heating with the help of a heating device.

30. The method of claim 8, wherein a movement of cooling fluid is regulated or controlled only via differences in pressure and/or temperature in the condenser chambers and the evaporator chamber.

31. The method of claim 11, wherein the method is carried out as a continuous or pulsed process of pumping liquid cooling fluid into the evaporator chamber.

32. The method of claim 11, wherein a temperature reduction is effected by cooling with the help of at least one cold head and/or a temperature increase is effected with the help of at least one cold head by heating with the help of a heating device.

33. The method of claim 11, wherein a movement of cooling fluid is regulated or controlled only via differences in pressure and/or temperature in the condenser chambers and the evaporator chamber.

34. The method of claim 12, wherein the method is carried out as a continuous or pulsed process of pumping liquid cooling fluid into the evaporator chamber.

35. The method of claim 12, wherein a temperature reduction is effected by cooling with the help of at least one cold head and/or a temperature increase is effected with the help of at least one cold head by heating with the help of a heating device.

36. The method of claim 12, wherein a movement of cooling fluid is regulated or controlled only via differences in pressure and/or temperature in the condenser chambers and the evaporator chamber.

* * * * *